(12) United States Patent
Huang et al.

(10) Patent No.: US 8,904,326 B2
(45) Date of Patent: Dec. 2, 2014

(54) SEMICONDUCTOR DEVICE DESIGN METHOD, SYSTEM AND COMPUTER PROGRAM PRODUCT

(75) Inventors: Mu-Jen Huang, Taipei (TW); Chih Chi Hsiao, Hsinchu (TW); Wei-Ting Lin, New Taipei (TW); Tsung-Hsin Yu, Hsinchu (TW); Chien-Wen Chen, Hsinchu (TW); Yung-Chow Peng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/539,258

(22) Filed: Jun. 29, 2012

(65) Prior Publication Data
US 2014/0007031 A1 Jan. 2, 2014

(51) Int. Cl.
*G06F 9/455* (2006.01)
*G06F 17/50* (2006.01)

(52) U.S. Cl.
USPC ........... 716/112; 716/106; 716/111; 716/119; 716/126; 716/127

(58) Field of Classification Search
USPC ............. 716/51, 52, 106, 111, 112, 119, 126, 716/127
See application file for complete search history.

(56) References Cited

U.S. PATENT DOCUMENTS

| | | | |
|---|---|---|---|
| 5,446,674 A * | 8/1995 | Ikeda et al. | 716/112 |
| 6,055,366 A * | 4/2000 | Le et al. | 716/112 |
| 6,405,346 B1 * | 6/2002 | Nawa | 716/115 |
| 6,842,727 B1 * | 1/2005 | Hayashi | 703/18 |
| 7,469,389 B2 * | 12/2008 | Namba et al. | 716/120 |
| 7,490,309 B1 * | 2/2009 | Kukal et al. | 716/132 |
| 7,536,658 B2 * | 5/2009 | Kwon et al. | 716/104 |
| 7,774,727 B2 * | 8/2010 | Arizono | 716/52 |
| 7,971,171 B2 * | 6/2011 | Keinert et al. | 716/115 |
| 8,191,030 B2 * | 5/2012 | Kemerer et al. | 716/136 |
| 2002/0188920 A1 * | 12/2002 | Lampaert et al. | 716/10 |
| 2003/0121019 A1 * | 6/2003 | Brown et al. | 716/12 |
| 2004/0031007 A1 * | 2/2004 | Hirakimoto et al. | 716/8 |
| 2005/0138591 A1 * | 6/2005 | Shirai et al. | 716/11 |
| 2006/0129964 A1 * | 6/2006 | Shibasaki et al. | 716/12 |
| 2006/0225012 A1 * | 10/2006 | Deura | 716/5 |
| 2007/0209026 A1 * | 9/2007 | Kemerer et al. | 716/4 |
| 2008/0127020 A1 * | 5/2008 | Rittman | 716/10 |
| 2009/0013290 A1 * | 1/2009 | Keinert et al. | 716/4 |
| 2009/0150842 A1 * | 6/2009 | Kemerer et al. | 716/5 |
| 2009/0210835 A1 * | 8/2009 | Phan Vogel | 716/5 |
| 2009/0326873 A1 * | 12/2009 | Wang et al. | 703/1 |
| 2012/0023471 A1 * | 1/2012 | Fischer et al. | 716/115 |
| 2012/0053923 A1 * | 3/2012 | Li et al. | 703/14 |
| 2013/0055184 A1 * | 2/2013 | Shroff et al. | 716/112 |

\* cited by examiner

*Primary Examiner* — Thuan Do
*Assistant Examiner* — Brian Ngo
(74) *Attorney, Agent, or Firm* — Lowe Hauptman & Ham, LLP

(57) ABSTRACT

In a semiconductor device design method performed by at least one processor, location data of at least one electrical component in a layout of a semiconductor device is extracted by the at least one processor. Voltage data associated with the at least one electrical component and based on a simulation of an operation of the semiconductor device is extracted by the at least one processor. Based on the extracted location data, the extracted voltage data is incorporated, by the at least one processor, in the layout to generate a modified layout of the semiconductor device.

20 Claims, 10 Drawing Sheets

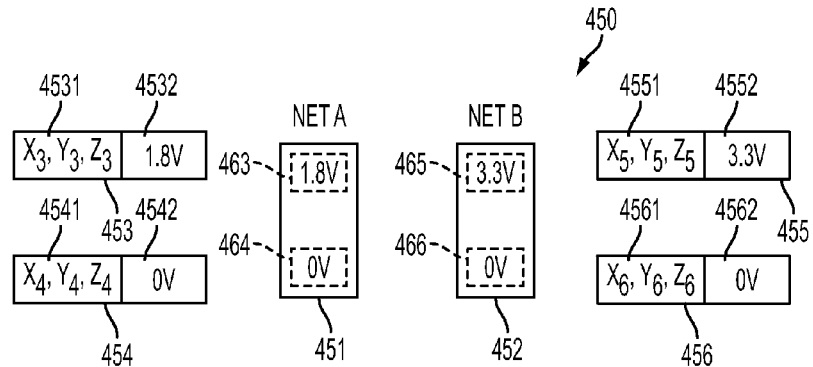
FIG. 4C
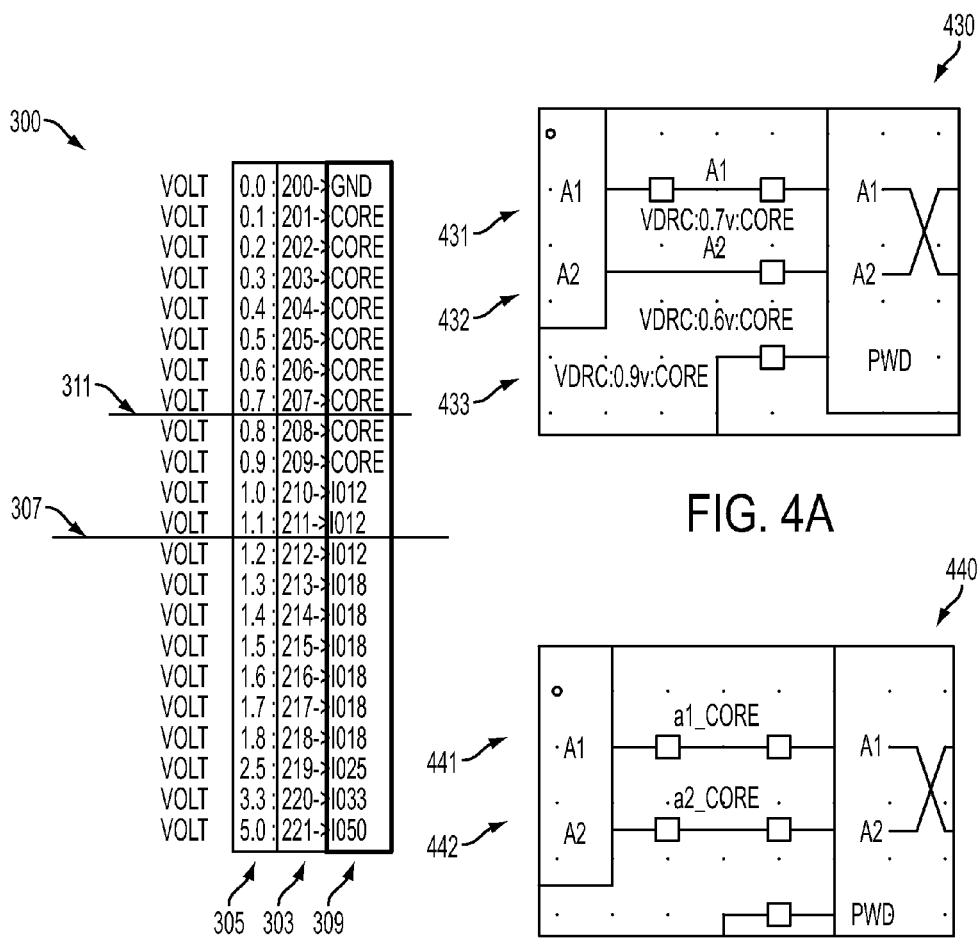
FIG. 4A
FIG. 3
FIG. 4B

SEMICONDUCTOR DEVICE DESIGN METHOD, SYSTEM AND COMPUTER PROGRAM PRODUCT

BACKGROUND

The recent trend in miniaturizing integrated circuits (ICs) has resulted in smaller devices which consume less power, yet provide more functionality at higher speeds than before. The miniaturization process has also resulted in stricter design and manufacturing specifications. Pre-manufacture checking and testing are performed to make sure that a semiconductor device can be made and will function as designed.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 3 is a view of an example voltage value conversion table for use with a semiconductor device design system in accordance with some embodiments.

FIG. 4A is a view of a portion of a schematic of a semiconductor device with incorporated voltage data in accordance with some embodiments.

FIG. 4B is a view of a portion of a schematic of a semiconductor device with incorporated voltage data in accordance with some embodiments.

FIG. 4C is a view of a portion of a modified layout of a semiconductor device with incorporated voltage data in accordance with some embodiments.

DETAILED DESCRIPTION

Figure 1:
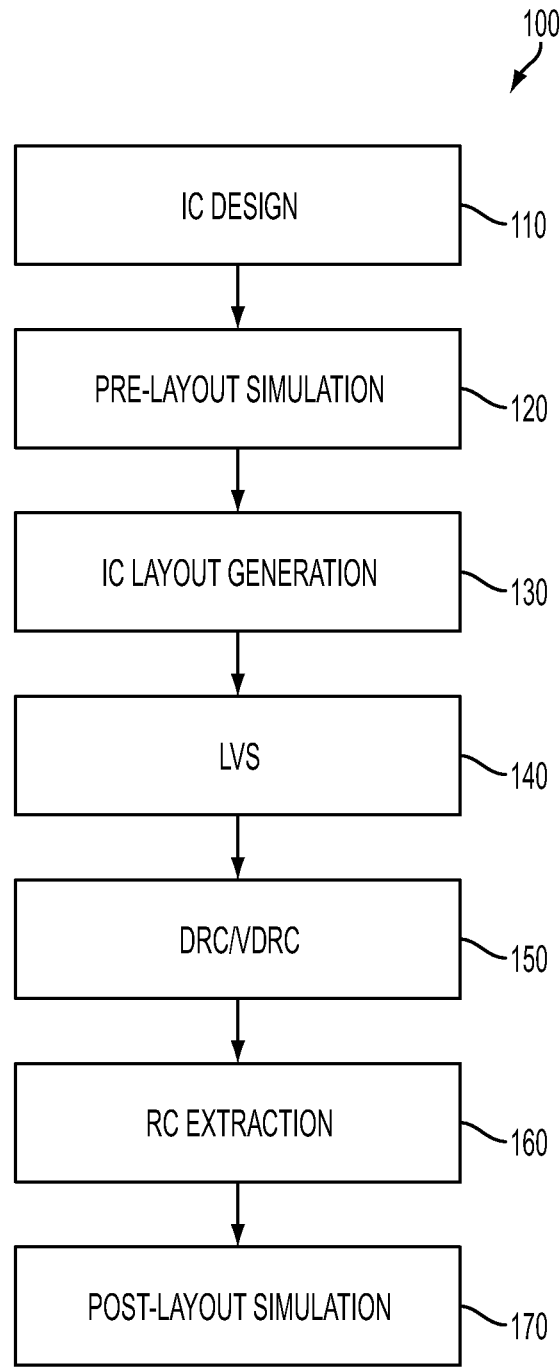
FIG. 1 is a functional flow chart of at least a portion of a semiconductor device design flow in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent, however, that one or more embodiments may be practiced without these specific details. Like reference numerals in the drawings denote like elements.

Some embodiments describe a semiconductor device design method and system in which voltage data based on a simulation of an operation of a semiconductor device is incorporated in a layout of the semiconductor device. The layout with the incorporated voltage data is used for a voltage-dependent design rule check (VDRC). A VDRC is a design rule check (DRC) that is performed to check compliance of the layout with one or more voltage-dependent design rules, as described herein. As a result, it is possible to perform the VDRC with improved accuracy and/or efficiency with respect to prior approaches.

FIG. 1 is a functional flow chart of at least a portion of a semiconductor device design flow 100 in accordance with some embodiments. The design flow 100 utilizes one or more electronic design automation (EDA) tools for testing a design of a semiconductor device before manufacturing the same device. The EDA tools, in some embodiments, are one or more sets of executable instructions for execution by a processor or controller or a programmed computer to perform the indicated functionality.

At operation 110, a design of a semiconductor device is provided by a circuit designer. In some embodiments, the design of the semiconductor device includes a schematic, i.e., an electrical diagram, of the semiconductor device. In some embodiments, the schematic is generated or provided in the form of a schematic netlist, such as a Simulation Program with Integrated Circuit Emphasis (SPICE) netlist. Other data formats for describing the design are usable in some embodiments.

At operation 120, a pre-layout simulation is performed, e.g., by an EDA tool, such as HSPICE available from Synopsys, Inc. of Mountain View, Calif., on the design to determine whether the design meets a predetermined specification. If the design does not meet the predetermined specification, the semiconductor device is redesigned. In some embodiments, a SPICE simulation is performed on the SPICE netlist. Other simulation tools are usable, in place of or in addition to the SPICE simulation, in other embodiments.

At operation 130, a layout of the semiconductor device is generated based on the design. In some embodiments, the layout is generated in the form of a Graphic Design System (GDS) file by an EDA tool, such as VIRTUOSO available from Cadence Design Systems, Inc. of San Jose, Calif. Other tools and/or data formats for describing the layout are usable in other embodiments.

At operation 140, a layout-versus-schematic (LVS) check, is performed. The LVS check is run to ensure that the generated layout corresponds to the design. Specifically, an LVS checking tool, i.e., an EDA tool, such as CALIBRE available from Mentor Graphics Inc. of Wilsonville, Oreg., recognizes electrical components as well as connections therebetween from the pattern of the generated layout. The LVS checking tool then generates a layout netlist representing the recognized electrical components and connections. The layout netlist generated from the layout is compared, by the LVS checking tool, with the schematic netlist of the design. If the two netlists match within a matching tolerance, the LVS check is passed. Otherwise, correction is made to at least one of the layout or the design by returning the process to operation 110 and/or operation 130.

At operation 150, a design rule check (DRC) is performed, e.g., by an EDA tool, such as CALIBRE, on the GDS file representing the layout, to ensure that the layout satisfies certain manufacturing design rules, i.e., to ensure that the semiconductor device can be manufactured. If one or more design rules is violated, correction is made to at least one of the layout or the design by returning the process to operation 110 and/or operation 130. Examples of design rules include, but are not limited to, a width rule which specifies a minimum width of a pattern in the layout, a spacing rule which specifies a minimum spacing between adjacent patterns in the layout, an area rule which specifies a minimum area of a pattern in the layout, etc.

In one or more embodiments, at least one of the design rules is voltage-dependent. For example, a metal-to-via spacing rule specifies a minimum spacing between a metal pattern and an adjacent via in the layout of the semiconductor device. In some embodiments, such a minimum spacing is dependent on a voltage expected or predicted to occur at the metal pattern or the via during an operation of the semiconductor device. Specifically, the metal-to-via spacing rule specifies an increasing series of metal-to-via spacings corresponding to an increasing series of voltage values or ranges expected or predicted to occur at the metal pattern or the via in operation. For example, for a voltage range of 0 V-1.2 V (Volt) expected or predicted to occur at the metal pattern in operation, the metal-to-via spacing rule specifies a minimum metal-to-via spacing of 0.05 μm (micrometer), and for a greater voltage range of 1.2 V-1.8 V, the metal-to-via spacing rule specifies a larger minimum metal-to-via spacing of 0.06 μm, etc. In some embodiments, a minimum spacing between the metal pattern and an adjacent via is dependent on a voltage difference expected or predicted to occur between the metal pattern or the via during an operation of the semiconductor device. Examples of further voltage-dependent design rules include, but are not limited to, metal-to-metal spacing rule, polysilicon-to-oxide definition (PO-to-OD) spacing rule, PO-to-PO spacing rule, etc. A DRC that is performed to check compliance of a layout with one or more voltage-dependent design rules is referred to as a VDRC. In one or more embodiments, VDRCs are performed at advanced nodes, such as the 28-nanometer (N28) technology node and beyond. In one or more embodiments, VDRCs are performed for technology nodes less advanced than N28.

At operation 160, a resistance and capacitance (RC) extraction is performed, e.g., by an EDA tool, such as HIPEX available from Silvaco, Inc. of Santa Clara, Calif., to determine parasitic parameters, e.g., parasitic resistance and parasitic capacitance, of interconnects in the semiconductor device layout for timing simulations in a subsequent operation. Other verification processes are usable in other embodiments.

At operation 170, a post-layout simulation is performed by a simulation tool, i.e., an EDA tool, to determine, taking the extracted parasitic parameters into account, whether the layout meets a predetermined specification. If the simulation indicates that the layout does not meet the predetermined specification, e.g., if the parasitic parameters cause undesirable delays, correction is made to at least one of the layout or the design by returning the process to operation 110 and/or operation 130. Otherwise, the layout is passed to manufacture or additional verification processes. In some embodiments, the post-layout simulation is a HSPICE simulation. Other simulation tools are usable, in place of or in addition to HSPICE, in some embodiments.

In some embodiments, one or more of the above-described operations are omitted. For example, the RC extraction in operation 160 and the post-layout simulation in operation 170 are omitted in one or more embodiments. The pre-layout simulation in operation 120 or the post-layout simulation in operation 170 is omitted in one or more embodiments.

In some embodiments, voltage data for one or more patterns in the layout of a semiconductor device is entered for use in a VDRC as described with respect to operation 150. The voltage data is enterable manually by a human operator based on, for example, experience of the operator. Such an approach involves certain risks of data inaccuracy and/or human error. As complexity of semiconductor devices increases, the amount of data to be entered is also increased which, in turn, further increases the risk of data inaccuracy and/or human error.

Some embodiments, therefore, provide semiconductor device design methods and systems in which voltage data based on a simulation of an operation of a semiconductor device is automatically incorporated in a layout of the semiconductor device to enable a VDRC with higher accuracy and efficiency than when voltage data is manually entered. In one or more embodiments, the voltage data is entirely based on the simulation of the operation of the semiconductor device. In one or more embodiments, the voltage data is partially based on the simulation and partially based on user input.

Figures 2A, 2B, 2C:
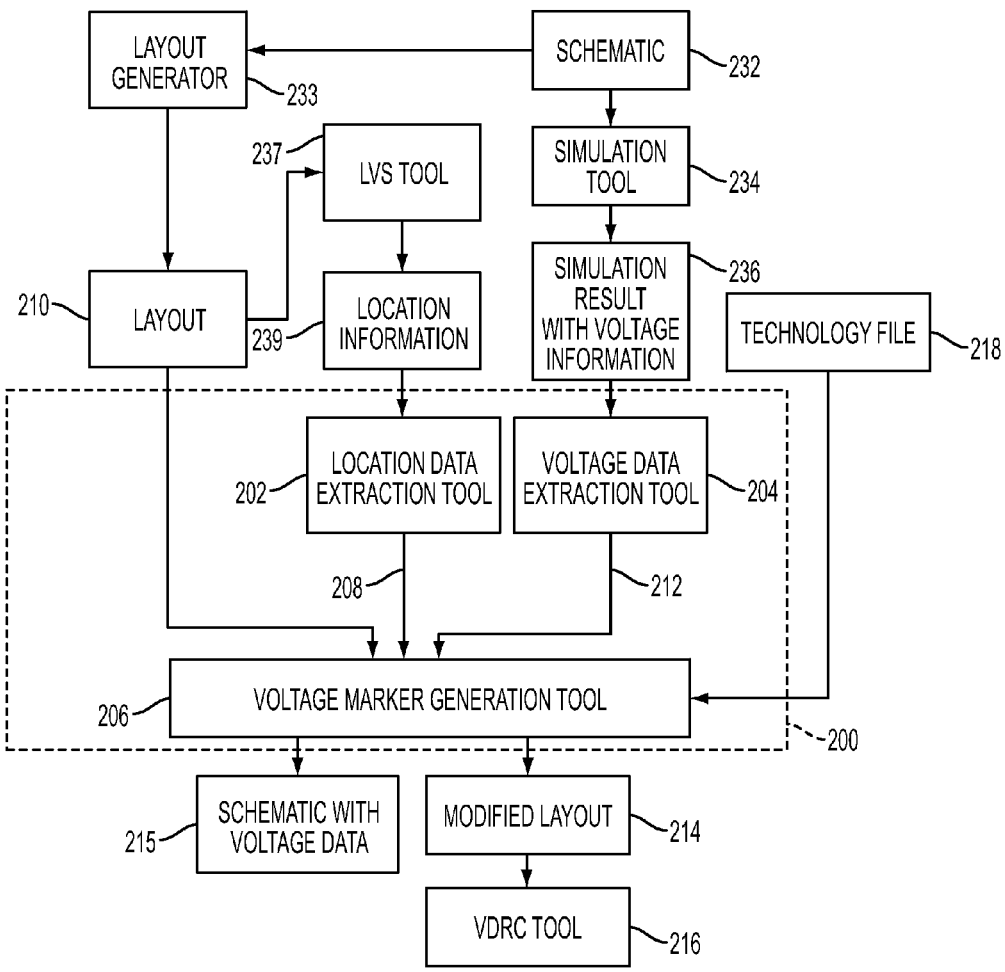
FIG. 2A is a block diagram of a semiconductor device design system in accordance with some embodiments.
FIGS. 2B and 2C are schematic views of data structures of location data and voltage data extracted by a semiconductor device design system in accordance with some embodiments.

FIG. 2A is a block diagram of a semiconductor device design system 200 in accordance with some embodiments. The semiconductor device design system 200 includes a location data extraction tool 202, a voltage data extraction tool 204 and a voltage marker generation tool 206. The location data extraction tool 202 is configured to extract location data 208 of at least one electrical component in a layout 210 of a semiconductor device. The voltage data extraction tool 204 is configured to extract voltage data 212 associated with the at least one electrical component based on a simulation of an operation of the semiconductor device. Input data of the voltage marker generation tool 206 includes the layout 210, location data 208 and voltage data 212. Based on the extracted location data 208, the voltage marker generation tool 206 incorporates the extracted voltage data 212 in the layout 210 to generate a modified layout 214 of the semiconductor device. The modified layout 214 is used, in one or more embodiments, in a VDRC verification by a VDRC tool 216.

In some embodiments, the layout 210 of a semiconductor device includes a plurality of circuit elements and a plurality of nets. A circuit element is an active element or a passive element. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drains. Examples of passive elements include, but are not limited to, capacitors, inductors, fuses, and resistors. Examples of nets include, but are not limited to, vias, conductive pads, conductive traces, and conductive redistribution layers. In one or more embodiments, a circuit element or a net includes at least one pattern, such as a metal pattern, an OD pattern, a PO pattern, etc. Several circuit elements and/or nets, which are electrically connected together, define a block. In one or more embodiments, an electrical component of the layout 210 includes one or more of (i) at least one portion of a block, (ii) at least one portion of a net, or (iii) at least one portion of a circuit element. For simplicity and unless otherwise specified, electrical components in the description below are nets.

The location data extraction tool 202 extracts the location data 208 of at least one electrical component in the layout 210. In some embodiments, the location data 208 associates a name of the electrical component with a physical location of the electrical component in the layout 210. FIG. 2B is a schematic view of a data structure of the location data 208. For example, for a given net, the location data 208 includes a name Net_ID of the net, as indicated at 207 in FIG. 2B. The location data 208 further includes a physical location Net_Location of the net, as indicated at 209 in FIG. 2B. In one or more embodiments, the physical location includes X, Y and Z coordinates of the net. The X and Y coordinates of the net are coordinates of a lower left corner of a pattern of the net in an X-Y plane, whereas the Z coordinate of the net is an identifier of a layer, e.g., a metal layer, in which the net is formed. In the specific example of the location data 208 shown in FIG. 2B, one net has a name "A1" and coordinates (X1,Y1,Z1), whereas another net has a name "A2" and coordinates (X2, Y2,Z2). Other approaches for identifying a physical location of an electrical component in the location data 208 are within the scope of various embodiments.

The voltage data extraction tool 204 extracts the voltage data 212 associated with the electrical component based on a simulation of an operation of the semiconductor device. In some embodiments, the voltage data 212 associates the name of the electrical component with a voltage value obtained for the electrical component during the simulation. FIG. 2C is a schematic view of a data structure of the voltage data 212. For example, for a given net, the voltage data 212 includes the name Net_ID of the net, as indicated at 211 in FIG. 2C, and a voltage value Net_Voltage obtained for the net during the simulation, as indicated at 213 in FIG. 2C. In the specific example of the voltage data 212 shown in FIG. 2C, the net having the name "A1" has a simulated voltage value of 0.9 V, whereas the other net having the name "A2" has a simulated voltage value of 0.7 V. When more than one voltage values are obtained for the net during the simulation, the voltage data extraction tool 204 includes the largest voltage value, or the average voltage value, as Net_Voltage in the voltage data 212 in one or more embodiments. Other arrangements are within the scope of various embodiments.

Input data of the voltage marker generation tool 206 includes the location data 208 and the voltage data 212. The voltage marker generation tool 206 incorporates the voltage data 212, based on the location data 208, into the layout 210 to generate the modified layout 214 with the incorporated voltage data. For example, the voltage marker generation tool 206 maps the location data 208 to the voltage data 212 using, for example, the name Net_ID of the net. The mapped data includes the physical location Net_Location of the net, and the voltage value Net_Voltage of the net. The voltage marker generation tool 206 then adds an additional layer (also referred to herein as a marker layer) to the layout 210 at a physical location corresponding to the Net_Location included in the mapped data. In one or more embodiments, the marker layer includes at least one of (i) the voltage value Net_Voltage included in the mapped data or (ii) a voltage indicator corresponding to the voltage value Net_Voltage included in the mapped data.

In some embodiments, the voltage indicator is determined based on a voltage value conversion table that correlates a plurality of voltage indicators to a plurality of voltage values. An example voltage value conversion table 300 is illustrated in FIG. 3. The voltage value conversion table 300 includes a plurality of voltage indicators 303 and corresponding voltage values 305. Each voltage value corresponds to a voltage indicator. For example, as shown in line 307 of the voltage value conversion table 300, the voltage value 1.1 V corresponds to the voltage indicator "211". For a net having a voltage value of 1.1 V obtained during the simulation, voltage data including at least one of (i) the voltage value 1.1 V or (ii) the voltage indicator "211" is incorporated in the modified layout 214.

In one or more embodiments, a voltage value, for example, 1.1 V, is incorporated in the modified layout 214. A VDRC tool 216 reads the modified layout 214 which includes the incorporated voltage data. The VDRC tool 216 then uses the read voltage value 1.1 V incorporated in a particular net for checking at least one voltage-dependent design rule related to the net. Assuming that the voltage-dependent design rule applicable to the net is the above-described metal-to-via spacing rule that specifies a minimum metal-to-via spacing of 0.05 μm for a voltage range of 0 V-1.2 V, the VDRC tool 216 then checks if the net associated with the read voltage value 1.1 V (which is within the voltage range of 0-1.2 V of the voltage-dependent design rule) satisfies the requirement of a minimum metal-to-via spacing of 0.05 μm.

In one or more embodiments, a voltage indicator, for example "211," is incorporated in the modified layout 214. The VDRC tool 216 reads the modified layout 214 which includes the incorporated voltage data. The VDRC tool 216 reads the marker layer associated with a particular net and recognizes that the voltage data associated with the net includes a voltage indicator or data type of "211." The VDRC tool 216 then refers to the voltage value conversion table 300 to obtain the corresponding voltage value of 1.1 V. The VDRC tool 216 then uses the obtained voltage value 1.1 V for checking at least one voltage-dependent design rule related to the net, as described above. In one or more embodiments, the voltage value conversion table 300 is transmitted from the semiconductor device design system 200 to the VDRC tool 216. Alternatively or additionally, the VDRC tool 216 obtains the voltage value conversion table 300 independent of the semiconductor device design system 200. In one or more embodiments, the modified layout 214 is outputted in the form of a GDS II file.

Besides voltage indicators 303 which are intended to be read by the VDRC tool 216, e.g., a computer executing particular instructions, the voltage value conversion table 300 further defines another group of voltage indicators 309 which are intended to be understandable by a human operator. Specifically, the voltage indicators 309 include human-friendly voltage indicators, such as "GND" (ground), "CORE," "IO12" (input/output), "IO18," "IO25," "IO33," and "IO50." The voltage values 305 correspond to the voltage indicators 303. For example, as shown in the line 307 of the voltage value conversion table 300, the voltage value 1.1 V corresponds to the voltage indicator "IO12." In the specific example voltage value conversion table 300, more than one voltage values correspond to a single voltage indicator 309. Specifically, a plurality of voltage values 0.0 V-0.9 V corresponds to a single voltage indicator "CORE." In some embodiments, the voltage indicators 309 are useful when presented together with the modified layout 214 to a human operator.

FIG. 4A is a view of a portion of a schematic 430 with incorporated voltage data in accordance with some embodiments. The schematic 430 is an electrical representation of a modified layout with incorporated voltage data, such as the modified layout 214. In one or more embodiments, the schematic 430 is outputted by the semiconductor device design system 200 by converting the modified layout 214 into the corresponding schematic, or by incorporating the extracted voltage data 212 in an initial schematic of the semiconductor device. In one or more embodiments, the schematic 430 is generated by a separate tool outside the semiconductor device design system 200. The schematic 430 includes several nets A1, A2 and PWD (power). The nets A1, A2 and PWD are presented with associated voltage data 431, 432, 433 each of which includes both a voltage value and a voltage indicator. For example, the net A1 is presented with a voltage value 0.7 V and a voltage indicator "CORE." The voltage value 0.7 V corresponds to the voltage indicator "CORE" as shown at a line 311 in the voltage value conversion table 300. The voltage value 0.7 V and the voltage indicator "CORE" indicate to a human operator that the net A1 has a voltage value of 0.7 V in a simulation of an operation of the semiconductor device, and that the voltage value 0.7 V is a core voltage. In one or more embodiments, the voltage value or the voltage indicator is omitted from the schematic 430.

FIG. 4B is a view of a portion of a schematic 440 with incorporated voltage data in accordance with some embodiments. The schematic 440 is similar to the schematic 430, with an exception that the nets A1 and A2 are presented with associated voltage data 441 and 442 each of which includes a voltage indicator. For example, the net A1 is presented with a voltage indicator "a1_CORE." Unlike schematic 430, the voltage value 0.7 V, which was obtained at the net A1 during the simulation and corresponds to the voltage indicator "CORE," is not presented in the schematic 440. The voltage indicator "a1_CORE" includes the name "a1" of the net A1, and a suffix "CORE" which is obtained from the voltage value conversion table 300 at the line 311 corresponding to the voltage value 0.7 V obtained at the net A1 during the simulation. The voltage indicator "a1_CORE" indicates to a human operator that the net A1 has a core voltage.

In some embodiments, the representation of the incorporated voltage data in the schematic 430 or the schematic 440 as described with respect to FIG. 4A or 4B is also applicable to the modified layout 214. Specifically, the modified layout 214 is outputted in a form in which the incorporated voltage data associated with one or more nets is presented, e.g., overlaid, at the corresponding patterns of the nets. In some embodiments, at least one of (i) the group of voltage indicators 303 intended to be read by a machine or (ii) the group voltage indicators 309 intended to be read by a human operator is omitted from the voltage value conversion table 300. Other arrangements of the incorporated voltage data in the modified layout 214 are within the scope of various embodiments. In one or more embodiments, the voltage value conversion table 300 is inputted into the semiconductor device design system 200 via a technology file 218 (FIG. 2A) which contains, besides the voltage value conversion table 300, further technology-specific and/or process-specific information for use by the voltage marker generation tool 206. In one or more embodiments, the voltage value conversion table 300 is included in the semiconductor device design system 200.

In the foregoing description, the voltage data 212 associated with a net and incorporated in the modified layout 214 includes a voltage value obtained for the net during a simulation of an operation the semiconductor device. The incorporated voltage value is used by the VDRC tool 216 in a voltage-dependent design rule that specifies, for example, a minimum value of a spacing S between the net (also referred to herein as "Net A") and an adjacent net (also referred to herein as "Net B") in the layout of the semiconductor device. The minimum value of the spacing S is specified based on the simulated voltage value at either Net A or Net B. An example of such a voltage-dependent design rule (also referred to herein as the "Voltage rule") is given in Table I below.

TABLE I

| Voltage $V_A$ at Net A or Voltage $V_B$ at Net B | Spacing S between Net A and Net B |
| --- | --- |
| $V_A$ or $V_B$ = 0 V-2.5 V | S ≥ 0.06 μm |
| $V_A$ or $V_B$ = 2.5 V-3.3 V | S ≥ 0.07 μm |

As indicated in Table I, when the voltage $V_A$ or $V_B$ in a range of 0 V-2.5 V is obtained from the simulation for the Net A or Net B, the Voltage rule specifies a spacing S of at least 0.06 μm between the Net A and Net B. When the voltage $V_A$ or $V_B$ is in a greater voltage range of 2.5 V-3.3 V, the Voltage rule specifies a larger spacing S of at least 0.07 μm, etc. In one or more embodiments, when $V_A$ is different from $V_B$, the maximum value of $V_A$ and $V_B$ is used to specify the minimum value of the spacing S between the Net A and the Net B.

In the above described Voltage rule, the minimum value of the spacing S is determined based on the voltage value at either the Net A or the Net B. In some embodiments, the VDRC tool 216 uses a voltage-dependent design rule that specifies a minimum value of the spacing S based on a voltage difference between the Net A and Net B. An example of such a voltage-dependent design rule (also referred to herein as the "Delta Voltage rule") is given in Table II below.

TABLE II

| Voltage Difference ΔV between Net A and Net B | Spacing S between Net A and Net B |
| --- | --- |
| ΔV ≤ 2.5 V | S ≥ 0.06 μm |
| ΔV > 2.5 V | S ≥ 0.07 μm |

As indicated in Table II, when the voltage difference ΔV between the Net A and Net B is not greater than 2.5 V, the Delta Voltage rule specifies a spacing S of at least 0.06 μm between the Net A and Net B. When the voltage difference ΔV between the Net A and Net B is greater than 2.5 V, the Delta Voltage rule specifies a spacing S of at least 0.07 μm between the Net A and Net B. In one or more embodiments, the voltage difference ΔV is determined based on the voltages $V_A$ and $V_B$ of the Net A and the Net B, i.e., $\Delta V = |V_A - V_B|$. In one or more embodiments, when multiple voltage values are obtained, from the simulation, for either or both of the Net A and the Net B, the voltage difference ΔV is determined as the maximum possible voltage difference between the Net A and the Net B. For example, $$\Delta V = \max(|V_{A\_max} - V_{B\_min}|, |V_{B\_max} - V_{A\_min}|),$$

where $V_{A\_max}$ is a maximum value of $V_A$, $V_{A\_min}$ is a minimum value of $V_A$, $V_{B\_max}$ is a maximum value of $V_B$ and $V_{B\_min}$ is a minimum value of $V_B$.

In some situations, the Voltage rule and the Delta Voltage rule specify the same minimum value of the spacing S between the Net A and the Net B. An example situation is given below in Table III:

TABLE III

| Voltage of Net A | Voltage of Net B | Spacing S between Net A and Net B |
| --- | --- | --- |
| $V_{A\_max}$ = 1.8 V | $V_{B\_max}$ = 3.3 V | Voltage Rule: S ≥ 0.07 μm based on $V_{B\_max}$ of 3.3 V |
| $V_{A\_min}$ = 0 V | $V_{B\_min}$ = 0 V ΔV = 3.3 V | Delta Voltage rule: S ≥ 0.07 μm based on ΔV of 3.3 V |

As indicated in Table III, in accordance with the Voltage rule described with respect to Table I, the spacing S between Net A and Net B is specified to be at least 0.07 μm based on the maximum value of $V_A$ and $V_B$, i.e., $V_{B\_max}$ which is 3.3 V. In accordance with the Delta Voltage rule described with respect to Table II, the spacing S between Net A and Net B is specified to be at least 0.07 μm based on the maximum possible voltage difference between the Net A and the Net B, i.e., $|V_{B\_max} - V_{A\_min}|$ = 3.3 V–0 V=3.3 V. In this situation, the Voltage rule and the Delta Voltage rule specify the same minimum value of the spacing S. In other words, the Voltage rule and the Delta Voltage rule are equally accurate.

In some situations, however, the Delta Voltage rule is more accurate than the Voltage rule because the voltage difference ΔV between the Net A and Net B is a better factor for determining the spacing S between the Net A and Net B than the voltage value at either the Net A or the Net B. An example situation is given below in Table IV:

TABLE IV

| Voltage of Net A | Voltage of Net B | Spacing S between Net A and Net B |
|---|---|---|
| $V_{A\_max}$ = 1.8 V | $V_{B\_max}$ = 3.3 V | Voltage Rule: S ≥0.07 μm based on $V_{B\_max}$ of 3.3 V |
| $V_{A\_min}$ = 1.4 V | $V_{B\_min}$ = 3.3 V |  |
|  | ΔV = 1.9 V | Delta Voltage rule: S ≥0.06 μm based on ΔV of 1.9 V |

As indicated in Table IV, in accordance with the Voltage rule described with respect to Table I, the spacing S between Net A and Net B is specified to be at least 0.07 μm based on the maximum value of $V_A$ and $V_B$, i.e., $V_{B\_max}$ which is 3.3 V. In accordance with the Delta Voltage rule described with respect to Table II, the spacing S between Net A and Net B is specified to be at least 0.06 μm based on the maximum possible voltage difference between the Net A and the Net B, i.e., $|V_{B\_max} - V_{A\_min}|$=3.3 V−1.4 V=1.9 V. In this situation, the Voltage rule and the Delta Voltage rule specify different minimum values of the spacing S. If the spacing S between the Net A and Net B is, for example, 0.065 μm, the Voltage rule will issue an error because the minimum spacing of 0.07 μm specified by the Voltage rule is not met. Such an error, in this specific situation, is a false alarm because the voltage difference ΔV between the Net A and Net B has a maximum value of 1.9 V which permits forming the Net A and Net B at a closer spacing, i.e., as small as 0.06 μm pursuant to the Delta Voltage rule. In other words, the Delta Voltage rule is more accurate than the Voltage rule in that the Delta Voltage rule avoids false alarms in certain situations.

Another example situation is given below in Table V:

TABLE V

| Voltage of Net A | Voltage of Net B | Spacing S between Net A and Net B |
|---|---|---|
| $V_{A\_max}$ = 1.8 V | $V_{B\_max}$ = 1.8 V | Voltage Rule: S ≥0.06 μm based on $V_{B\_max}$ of 1.8 V |
| $V_{A\_min}$ = 0 V | $V_{B\_min}$ = −0.8 V |  |
|  | ΔV = 2.6 V | Delta Voltage rule: S ≥0.07 μm based on ΔV of 2.6 V |

As indicated in Table V, in accordance with the Voltage rule described with respect to Table I, the spacing S between Net A and Net B is specified to be at least 0.06 μm based on the maximum value of $V_A$ and $V_B$, i.e., $V_{B\_max}$ which is 1.8 V. In accordance with the Delta Voltage rule described with respect to Table II, the spacing S between Net A and Net B is specified to be at least 0.07 μm based on the maximum possible voltage difference between the Net A and the Net B, i.e., $|V_{A\_max} - V_{B\_min}|$=1.8 V−(−0.8 V)=2.6 V. In this situation, the Voltage rule and the Delta Voltage rule specify different minimum values of the spacing S. If the spacing S between the Net A and Net B is, for example, 0.065 μm, the Voltage rule will not issue an error because the minimum spacing of 0.06 μm specified by the Voltage rule is met. However, in this specific situation, an error exists because the voltage difference ΔV between the Net A and Net B has a maximum value of 2.6 V which does not permit forming the Net A and Net B at a spacing closer than 0.07 μm pursuant to the Delta Voltage rule. The Voltage rule misses the error. The Delta Voltage rule, in contrast, will issue an error in this specific situation. In other words, the Delta Voltage rule is more accurate than the Voltage rule in that the Delta Voltage rule avoids missing errors in certain situations.

In some embodiments, to enable the VDRC tool 216 to perform the Delta Voltage rule, the voltage marker generation tool 206 incorporates, for at least one net in the modified layout 214, a maximum voltage value and a minimum voltage value associated with the at least one net. The maximum voltage value and the minimum voltage value are included in the voltage data 212 extracted by the voltage data extraction tool 204. In one or more embodiments, the maximum voltage value is the highest voltage value among all voltage values associated with the at least one net, and/or the minimum voltage value is the lowest voltage value among all voltage values associated with the at least one net.

FIG. 4C is a view of a portion 450 of the modified layout 214 of the semiconductor device with incorporated voltage data for use in a Delta Voltage rule in accordance with some embodiments. The portion 450 of the modified layout 214 includes adjacent nets 451, 452 herein referred to as Net A and Net B. A maximum voltage value, e.g., 1.8 V, and a minimum voltage value, e.g., 0 V, extracted for Net A are incorporated in the modified layout 214 in the form of corresponding text layers 453, 454. A maximum voltage value, e.g., 3.3 V, and a minimum voltage value, e.g., 0 V, extracted for Net B are incorporated in the modified layout 214 in the form of corresponding text layers 455, 456. Similar to the marker layer described in the foregoing section, the text layers 453-456 do not present physical arrangements of electrical components or nets in the layout of the semiconductor device; rather, the text layers 453-456 include voltage data 212 associated with the corresponding nets.

Each of the text layers 453-456 includes a first part with location data and a second part with voltage data. For example, the text layer 453 includes a first part 4531 with location data and a second part 4532 with voltage data, the text layer 454 includes a first part 4541 with location data and a second part 4542 with voltage data, the text layer 455 includes a first part 4551 with location data and a second part 4552 with voltage data, and the text layer 456 includes a first part 4561 with location data and a second part 4562 with voltage data. In some embodiments, the location data in the first part of each text layer includes coordinates of a point or a region within the corresponding net. For example, the first part 4531 of the text layer 453 includes coordinates (X3,Y3, Z3) of a region 463 within the corresponding Net A, the first part 4541 of the text layer 454 includes coordinates (X4,Y4, Z4) of a region 464 within the corresponding Net A, the first part 4551 of the text layer 455 includes coordinates (X5,Y5, Z5) of a region 465 within the corresponding Net B, and the first part 4561 of the text layer 456 includes coordinates (X6,Y6,Z6) of a region 466 within the corresponding Net B. In one or more embodiment, the regions 463, 464 are at the same layer in the layout of the semiconductor device (i.e., Z3=Z4). In one or more embodiments, the regions 463, 464 are the same region or overlap each other. In one or more embodiment, the regions 465, 466 are at the same layer in the layout of the semiconductor device (i.e., Z5=Z6). In one or more embodiments, the regions 465, 466 are the same region or overlap each other.

The voltage data in the second part of each text layer includes a voltage value obtained for the corresponding net from a simulation of the operation of the semiconductor device. In one or more embodiments, the second part of each text layer further includes a voltage indicator indicating whether the voltage value is a maximum or a minimum voltage value. For example, the second part 4532 of the text layer 453 includes a voltage value "1.8 V" and a voltage indicator indicating that the voltage value of 1.8 V is a maximum voltage value obtained for the corresponding Net A. The second part 4542 of the text layer 454 includes a voltage value "0V" and a voltage indicator indicating that the voltage value of 0 V is a minimum voltage value obtained for the corresponding Net A. The second part 4552 of the text layer 455 includes a voltage value "3.3 V" and a voltage indicator indicating that the voltage value of 3.3 V is a maximum voltage value obtained for the corresponding Net B. The second part 4562 of the text layer 456 includes a voltage value "0V" and a voltage indicator indicating that the voltage value of 0 V is a minimum voltage value obtained for the corresponding Net B.

In some embodiments, the VDRC tool 216 reads the text layer 453 in the portion 450 of the modified layout 214. The VDRC tool 216 determines that the location data included in the first part 4531 of the text layer 453 indicates a region 463 within the Net A, and the VDRC tool 216 determines that the text layer 453 is associated with the Net A. The VDRC tool 216 further determines that the voltage data included in the second part 4532 of the text layer 453 indicates a maximum voltage value of 1.8 V, and the VDRC tool 216 determines that the maximum voltage value of the Net A is 1.8 V. Similarly, the VDRC tool 216 reads the text layers 454-456 in the portion 450 of the modified layout 214, and determines that the minimum voltage value of the Net A is 0 V, the maximum voltage value of the Net B is 3.3 V and the minimum voltage value of the Net B is 0 V. The VDRC tool 216 further determines the voltage difference ΔV between the Net A and Net B as 3.3 V as described with respect to Table III. The VDRC tool 216 then uses the determined voltage difference ΔV in a Delta Voltage rule.

To generate the modified layout 214 for use in the VDRC tool 216 as described above, the semiconductor device design system 200 receives input data from various tools and/or operations, for example, as described with respect to FIG. 1. An example arrangement of tools and/or operations that, in accordance with some embodiments, provide data for the semiconductor device design system 200 will be described with respect to FIG. 2A.

In FIG. 2A, a schematic 232 of the semiconductor device to be manufactured is generated or provided, for example, in the form of a schematic netlist as described with respect to operation 110 in FIG. 1. The schematic 232 is then provided to a layout generator 233 which generates the layout 210 from the schematic 232, as described with respect to operation 130 in FIG. 1. The schematic 232 is also provided to a simulation tool 234 which performs a pre-layout simulation on the schematic netlist, as described with respect to operation 120 in FIG. 1. The simulation tool 234 outputs a simulation result 236 with voltage information. In one or more embodiments, the simulation result 236 includes a database or at least one file that correlates the names or other identifying information of a plurality of nets with voltage values obtained at the nets during the simulation. The simulation result 236 serves as an input for the voltage data extraction tool 204 which extracts therefrom the voltage data 212 to be incorporated in the layout 210.

In one or more embodiments, the simulation tool 234 is a post-layout simulation tool which performs the simulation on the layout 210, rather than on the schematic 232, as described with respect to operation 170 in FIG. 1. The simulation result 236 in this case is a post-layout simulation result which also includes a database or at least one file that correlates the names or other identifying information of a plurality of nets with voltage values obtained at the nets during the post-layout simulation. The post-layout simulation result serves as an input for the voltage data extraction tool 204. In one or more embodiments, the simulation tool 234, which is a pre-layout simulation or a post-layout simulation tool, is included in the semiconductor device design system 200.

The layout 210 is inputted into an LVS tool 237 which performs an LVS check, as described with respect to operation 140 in FIG. 1. In some embodiments, the layout 210 is inputted into the LVS tool 237 in the form of a GDS II file. The LVS tool 237 refers to the GDS II file representing the layout 210, a LVS deck and a circuit description language (CDL) netlist and generates one or more databases (also referred to as SVDB) in which circuit elements and nets in the schematic 232 are linked to corresponding patterns in the layout 210. The SVDB also include coordinates of the pattern or patterns in the layout 210 that correspond to a circuit element or net in the schematic 232. As a result, the SVDB provides location information 239 which correlates the names or other identifying information of a plurality of nets in the schematic 232 with the corresponding coordinates in the layout 210. The location information 239 serves as an input for the location data extraction tool 202 which extracts therefrom the location data 208 to be used for incorporating the voltage data 212 in the layout 210. In one or more embodiments, the LVS tool 237 is included in the semiconductor device design system 200. In one or more embodiments, the location information 239 is obtainable by one or more other tools without using the LVS tool 237. Such other tools are included in the semiconductor device design system 200 in accordance with some embodiments.

In some embodiments, the schematic 232 is also inputted into the semiconductor device design system 200. The schematic 232 is used in one or more embodiments to generate a schematic 215 with the incorporated voltage data for use by a human operator, as described with respect to the schematic 430 and/or the schematic 440 in FIGS. 4A, 4B. For example, at least one of the voltage marker generation tool 206, the voltage data extraction tool 204 or another tool of the semiconductor device design system 200 incorporates the voltage data 212 in the schematic 232 to obtain the schematic 215 with the incorporated voltage data. Additionally or alternatively, the schematic 232 is used in one or more embodiments to generate at least one of the layout 210 or the location data 208 in the semiconductor device design system 200. Other arrangements are within the scope of various embodiments.

Figure 5A:
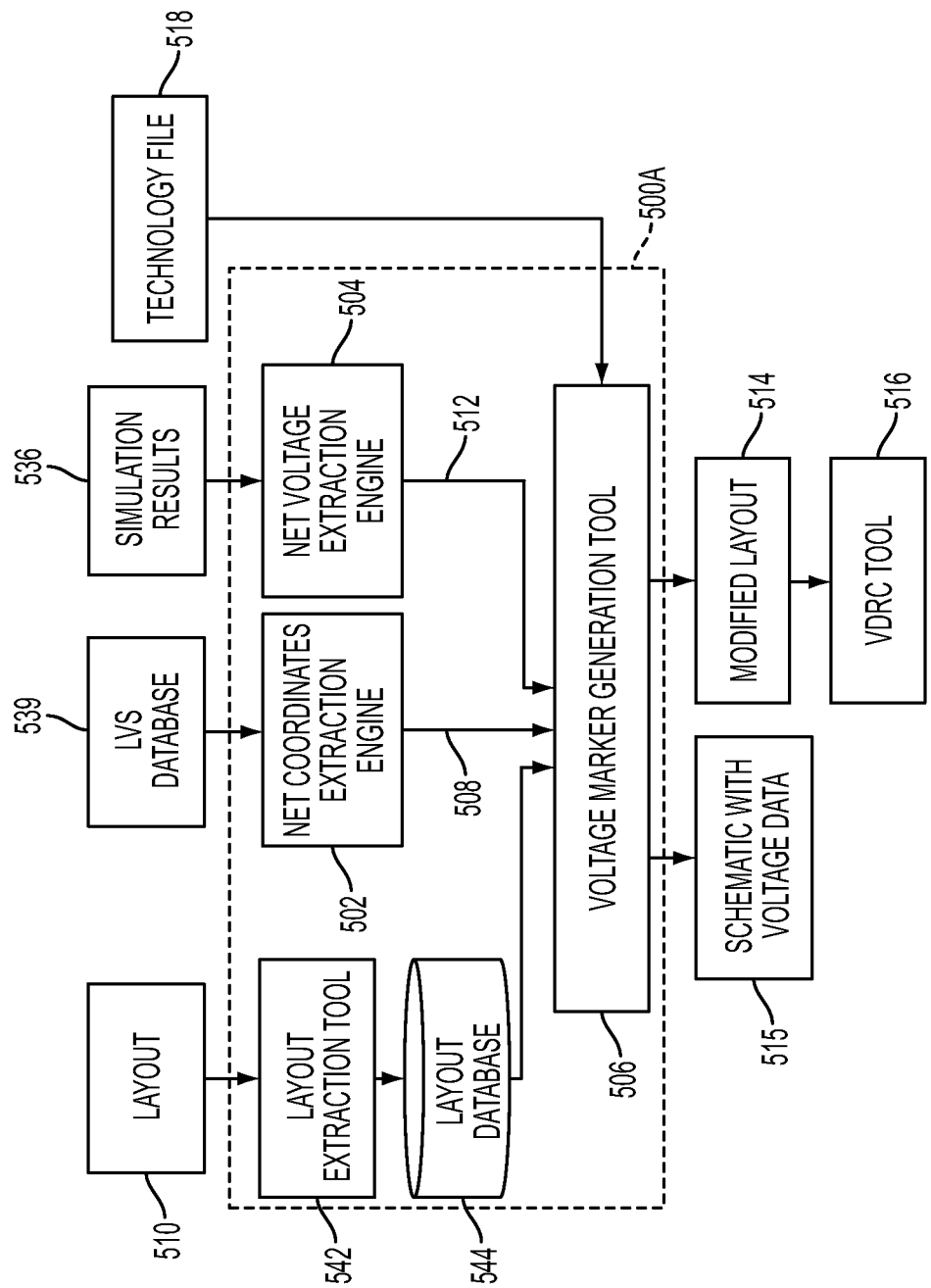
FIGS. 5A-5E are block diagrams of various semiconductor device design systems in accordance with some embodiments.

FIG. 5A is a block diagram of a semiconductor device design system 500A in accordance with some embodiments. The semiconductor device design system 500A includes a net coordinates extraction engine 502, a net voltage extraction engine 504 and a voltage marker generation tool 506 which correspond to the location data extraction tool 202, the voltage data extraction tool 204, and the voltage marker generation tool 206 of the semiconductor device design system 200, respectively. The semiconductor device design system 500A receives data input in the form of a layout 510, an LVS database (e.g., SVDB) 539, simulation results 536 and a technology file which correspond to the layout 210, the location information 239, the simulation result 236 and the technology file 218 described with respect to FIG. 2A, respectively. The net coordinates extraction engine 502 and the net voltage extraction engine 504 extract location data 508 and voltage data 512 similarly to the location data extraction tool 202 and the voltage data extraction tool 204 extracting the location data 208 and the voltage data 212. The voltage marker generation tool 506 incorporates the extracted location data 508 and voltage data 512 into the layout 510 to output a modified layout 514 for use in a VDRC tool 516 in a manner similar to the modified layout 214 for use in the VDRC tool 216 described with respect to FIG. 2A. In one or more embodiments, the semiconductor device design system 500A outputs a schematic 515 with the incorporated voltage data as described with respect to the schematic 430 and the schematic 440 in FIGS. 4A and 4B.

The semiconductor device design system 500A further includes a layout extraction tool 542 which generates a layout database 544 from the layout 510. In one or more embodiments, the layout 510 is inputted into the semiconductor device design system 500A in the form of a GDS II file. The GDS II file is read by the layout extraction tool 542 to generate the layout database 544 which includes descriptions and coordinates of various patterns in the layout 510. The layout database 544 is accessed by the voltage marker generation tool 506 to incorporate the voltage data 512 into the layout 510 at the pattern or patterns with the coordinates corresponding to the location data 508. As a result, the modified layout 514 with the incorporated voltage data is outputted. In one or more embodiments, the layout extraction tool 542 is implemented by a layout editor tool, such as VIRTUOSO. Other layout extraction tools are within the scope of various embodiments.

Figure 5B:
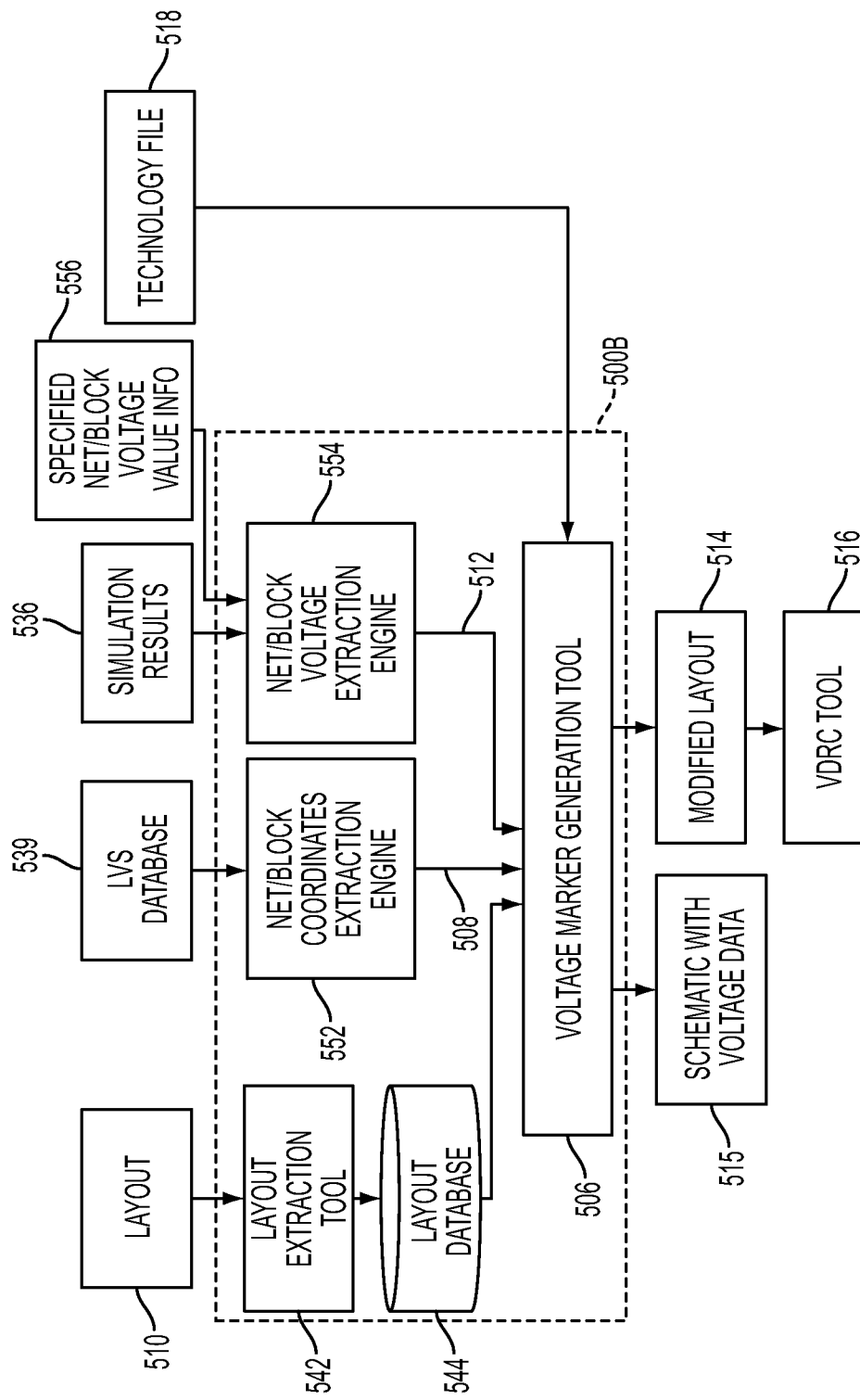

FIG. 5B is a block diagram of a semiconductor device design system 500B in accordance with some embodiments. The semiconductor device design system 500B is similar to the semiconductor device design system 500A in many aspects the description of which is omitted for simplicity.

The semiconductor device design system 500B includes a net/block coordinates extraction engine 552 and a net/block voltage extraction engine 554 corresponding to the net voltage extraction engine 504 and the net coordinates extraction engine 502 of the semiconductor device design system 500A, respectively. The net/block coordinates extraction engine 552 is configured to extract coordinates of one or more nets and/or one or more blocks of the layout 510 from the LVS database 539. Likewise, the net/block voltage extraction engine 554 is configured to extract voltage data of one or more nets and/or one or more blocks from the simulation results 536.

Input data of the net/block voltage extraction engine 554 further includes user input in the form of a specified net/block voltage value information 556 which specifies one or more voltage values for one or more nets and/or one or more blocks. When the simulation results 536 include one or more simulated voltage values for the same net or block specified in the specified net/block voltage value information 556, the net/block voltage extraction engine 554 extracts the largest voltage value, among all the simulated and user-specified voltage values for that net or block, as the voltage data to be incorporated in the layout 510. Other arrangements are within the scope of various embodiments. The remaining structure and/or operation of the semiconductor device design system 500B is/are similar to those of the semiconductor device design system 500A.

Figure 5C:
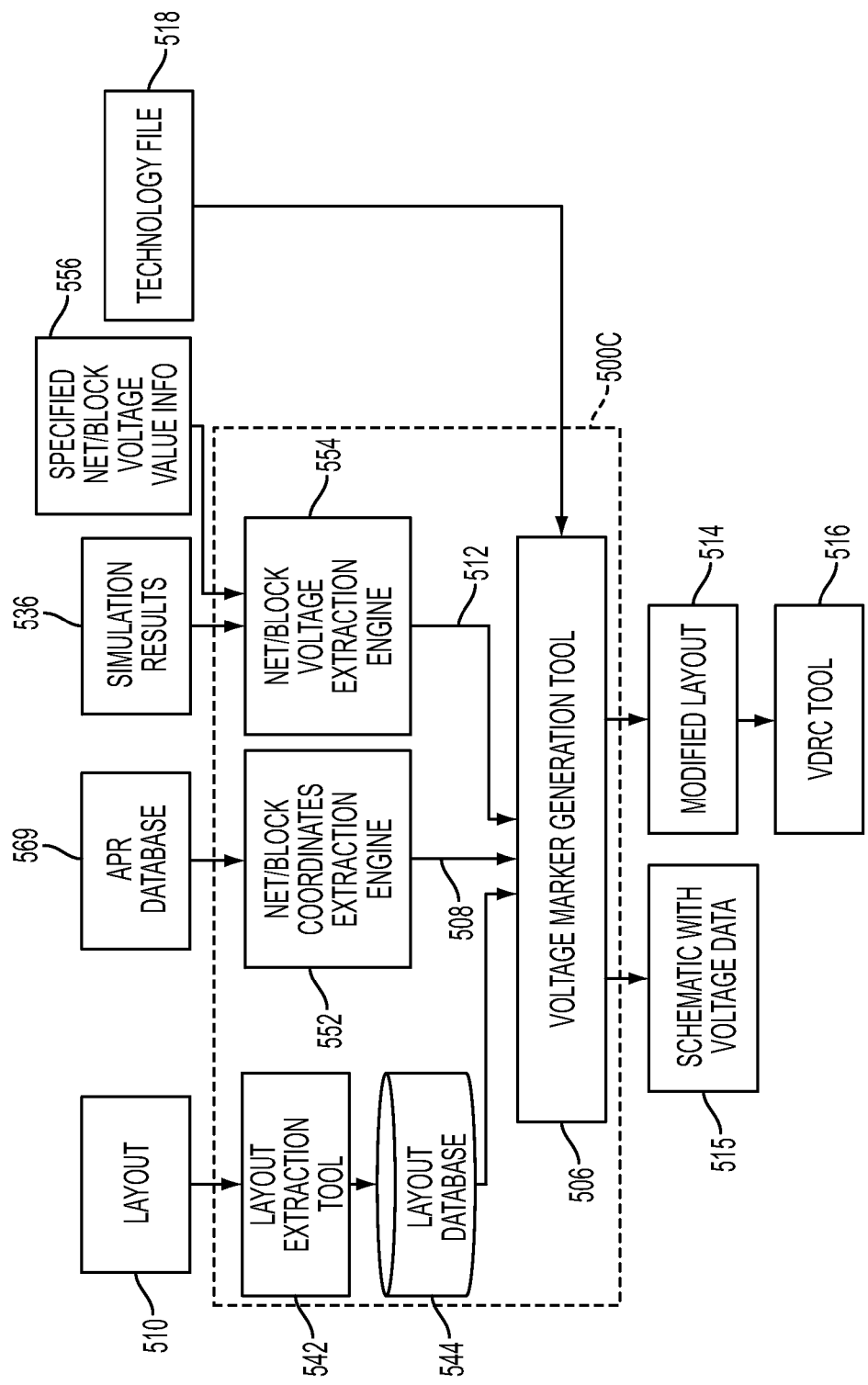

FIG. 5C is a block diagram of a semiconductor device design system 500C in accordance with some embodiments. The semiconductor device design system 500C is similar to the semiconductor device design system 500B in many aspects the description of which is omitted for simplicity. Input data of the net/block coordinates extraction engine 552 in the semiconductor device design system 500C includes location information from an Automatic Placement and Routing (APR) database 569. The APR database 569 is generated by an APR tool or engine and includes location information similar to that described with respect to FIG. 2A. The remaining structure and/or operation of the semiconductor device design system 500C is/are similar to those of the semiconductor device design system 500B.

Figure 5D:
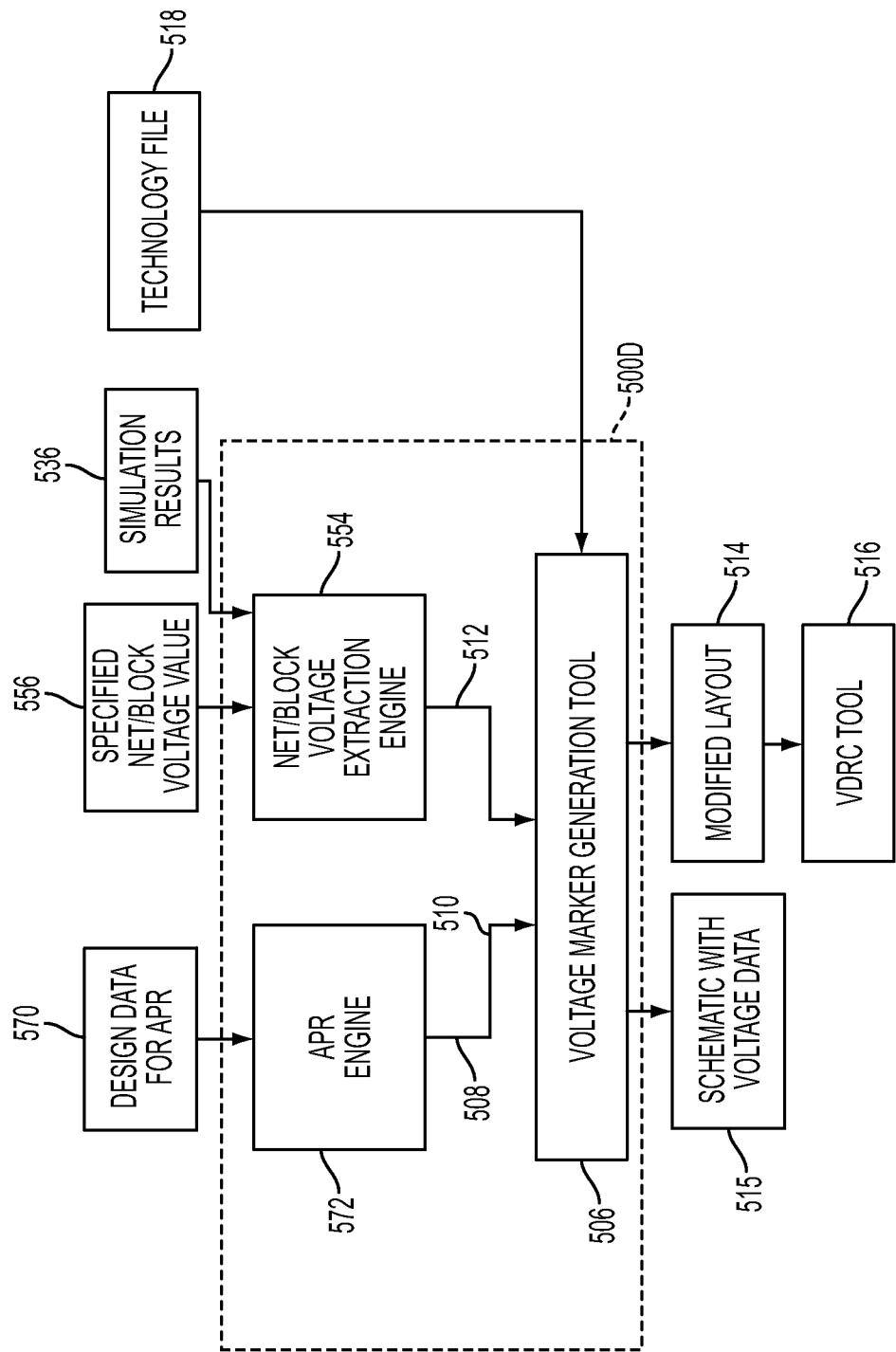

FIG. 5D is a block diagram of a semiconductor device design system 500D in accordance with some embodiments. The semiconductor device design system 500D is similar to the semiconductor device design system 500C in many aspects the description of which is omitted for simplicity. The semiconductor device design system 500D includes an APR engine or tool 572. Input data of the APR engine 572 includes Design Data for APR 570. The Design Data for APR 570 corresponds to the schematic 232 described with respect to FIG. 2A. From the Design Data for APR 570, the APR engine 572 generates the layout 510 and the location data 508 for use by the voltage marker generation tool 506. The remaining structure and/or operation of the semiconductor device design system 500D is/are similar to those of the semiconductor device design system 500C.

Figure 5E:
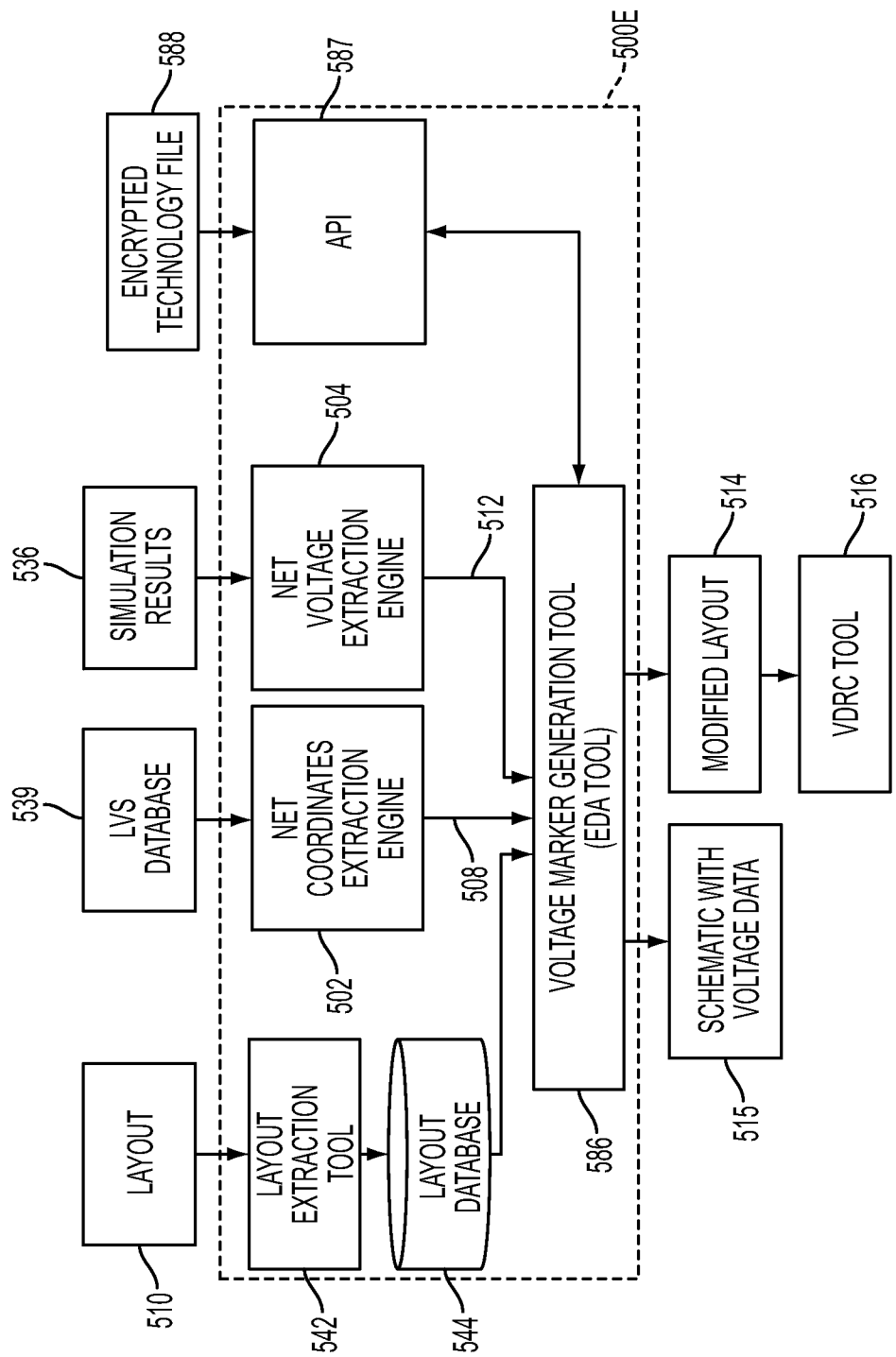

FIG. 5E is a block diagram of a semiconductor device design system 500E in accordance with some embodiments. The semiconductor device design system 500E is similar to the semiconductor device design system 500A in many aspects the description of which is omitted for simplicity. The voltage marker generation tool 586 of the semiconductor device design system 500E is configured as an EDA tool. The semiconductor device design system 500E further includes an application programming interface (API) 587 for communication with an external tool. For example, input data of the API 587 includes a technology file 588 which corresponds to the technology file 518. In one or more embodiments, the technology file 588 is encrypted. The API 587 decrypts the encrypted technology file 588 and provides the decrypted technology file 588 to the voltage marker generation tool 586 which uses the technology file to generate the modified layout 514. In one or more embodiments, the voltage marker generation tool 586 outputs the modified layout 514 and/or a schematic with the incorporated voltage data via the API 587 and/or in encrypted form to the external tool. The remaining structure and/or operation of the semiconductor device design system 500B is/are similar to those of the semiconductor device design system 500A.

In some embodiments, any one of the semiconductor device design systems 200, 500A, 500B, 500C, 500D or 500E is implemented by at least one computer system as described herein below with respect to FIG. 7. At least one processor of such a computer system is hardwired and/or programmed to function as one or more of the tools or engines of the corresponding semiconductor device design system 200, 500A, 500B, 500C, 500D or 500E. In one or more embodiments, any one of the semiconductor device design systems 200, 500A, 500B, 500C, 500D or 500E is implemented by several computer systems. In one or more embodiments, data exchange between the computer systems occurs over a network that connects the computer systems. Other modes of data exchange such as emails, external hard drives are usable in some embodiments. At least one processor of each computer system is hardwired and/or programmed to function as one or more of the tools or engines of the corresponding semiconductor device design system 200, 500A, 500B, 500C, 500D or 500E.

In some embodiments, by incorporating voltage data obtained from a simulation of an operation of a semiconductor device into the layout of the semiconductor device, one or more voltage-dependent operations, such as a VDRC, are performed with higher accuracy and efficiency than when voltage data is entered manually and/or based on human prediction or experience. As a result, the cycle time is reduced and human errors are minimized. In some embodiments, the whole chip coverage is obtainable in a VDRC or another voltage-dependent operation, as compared to a limited number of interested nets when voltage data is manually entered and/or based on human prediction or experience. A schematic with the incorporated voltage data also serves as a useful visual tool for a human operator, such as a circuit designer, in design correction and/or improvement.

Figure 6:
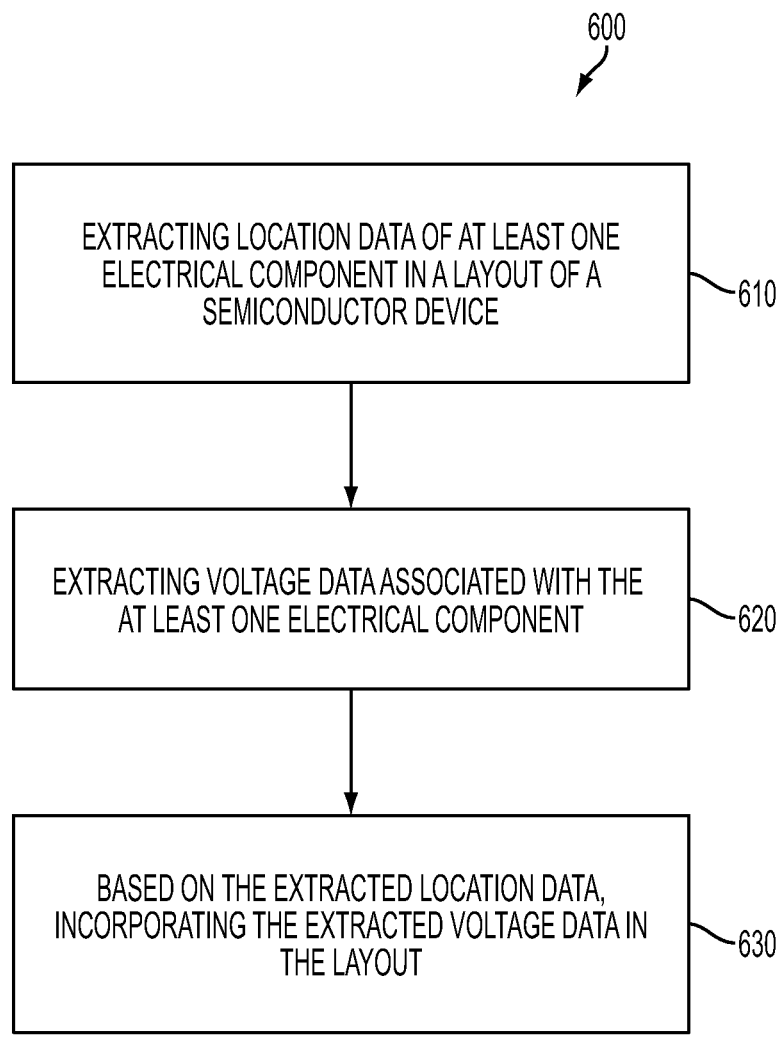
FIG. 6 is a flow chart of a semiconductor device design method in accordance with some embodiments.

FIG. 6 is a flow chart of a semiconductor device design method 600 in accordance with some embodiments. The method 600 is performed by one or more processors of one or more computer systems as described with respect to FIG. 7. The one or more processors are hardwired and/or programmed to define one or more tools or engines described with respect to FIGS. 2A and 5A-5E.

At operation 610, location data of at least one electrical component in a layout of a semiconductor device is extracted. For example, location data 208 (or 508) of at least one electrical component in a layout 210 (or 510) of a semiconductor device is extracted as described with respect to FIG. 2A (or any one of FIGS. 5A-5E).

At operation 620, voltage data based on a simulation of an operation of the semiconductor device and associated with the at least one electrical component is extracted. For example, voltage data 212 (or 512) based on a simulation of an operation of the semiconductor device and associated with the at least one electrical component is extracted, as described with respect to FIG. 2A (or any one of FIGS. 5A-5E).

At operation 630, based on the extracted location data, the extracted voltage data is incorporated in the layout to generate a modified layout of the semiconductor device. For example, based on the extracted location data 208 (or 508), the extracted voltage data 212 (or 512) is incorporated in the layout 210 (or 510) to generate a modified layout 214 (or 514) of the semiconductor device, as described with respect to FIG. 2A (or any one of FIGS. 5A-5E).

Figure 7:
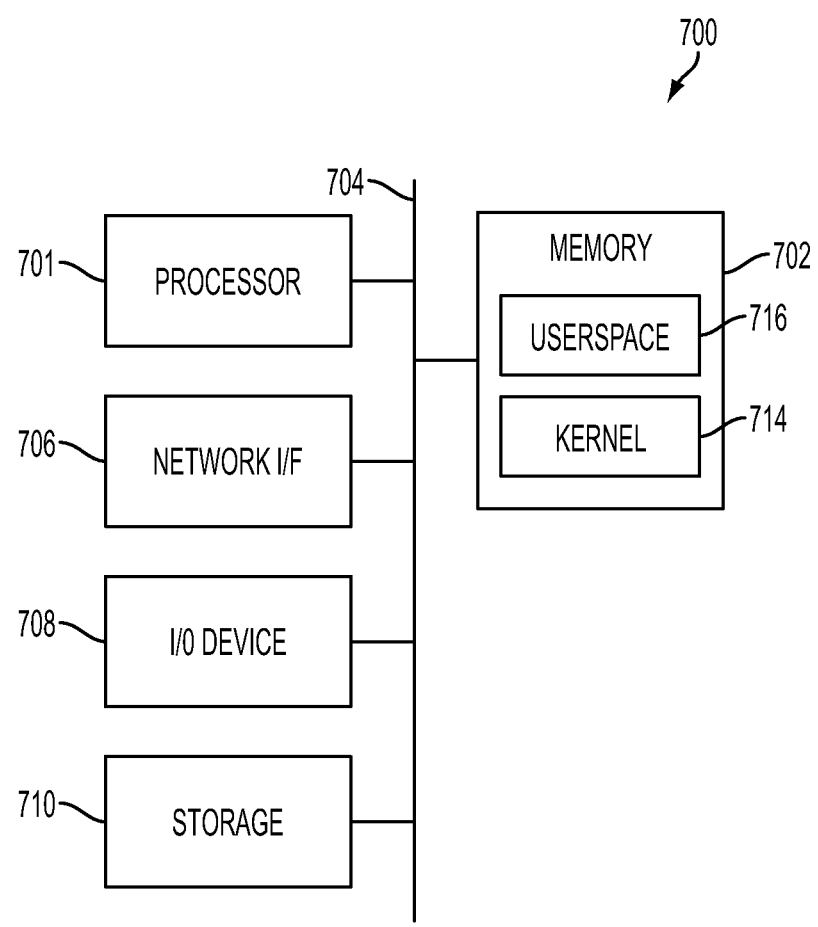
FIG. 7 is a block diagram of a computer system in accordance with some embodiments.

FIG. 7 is a block diagram of a computer system 700 in accordance with some embodiments. One or more of the tools and/or engines and/or systems and/or operations described with respect to FIGS. 1-6 is realized in some embodiments by one or more computer systems 700 of FIG. 7. The system 700 comprises at least one processor 701, a memory 702, a network interface (I/F) 706, a storage 710, an input/output (I/O) device 708 communicatively coupled via a bus 704 or other interconnection communication mechanism.

The memory 702 comprises, in some embodiments, a random access memory (RAM) and/or other dynamic storage device and/or read only memory (ROM) and/or other static storage device, coupled to the bus 704 for storing data and/or instructions to be executed by the processor 701, e.g., kernel 714, userspace 716, portions of the kernel and/or the userspace, and components thereof. The memory 702 is also used, in some embodiments, for storing temporary variables or other intermediate information during execution of instructions to be executed by the processor 701.

In some embodiments, a storage device 710, such as a magnetic disk or optical disk, is coupled to the bus 704 for storing data and/or instructions, e.g., kernel 714, userspace 716, etc. The I/O device 708 comprises an input device, an output device and/or a combined input/output device for enabling user interaction with the system 700. An input device comprises, for example, a keyboard, keypad, mouse, trackball, trackpad, and/or cursor direction keys for communicating information and commands to the processor 701. An output device comprises, for example, a display, a printer, a voice synthesizer, etc. for communicating information to a user.

In some embodiments, one or more operations and/or functionality of the tools and/or engines and/or systems described with respect to FIGS. 1-6 are realized by the processor 701, which is programmed for performing such operations and/or functionality. One or more of the memory 702, the I/F 706, the storage 710, the I/O device 708, the hardware components 718, and the bus 704 is/are operable to receive instructions, data, design rules, netlists, layouts, models and/or other parameters for processing by the processor 701.

In some embodiments, one or more of the operations and/or functionality of the tools and/or engines and/or systems described with respect to FIGS. 1-6 is/are implemented by specifically configured hardware (e.g., by one or more application specific integrated circuits (ASICs) which is/are included) separate from or in lieu of the processor 701. Some embodiments incorporate more than one of the described operations and/or functionality in a single ASIC.

In some embodiments, the operations and/or functionality are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, in a semiconductor device design method performed by at least one processor, location data of at least one electrical component in a layout of a semiconductor device is extracted by the at least one processor. Voltage data associated with the at least one electrical component and based on a simulation of an operation of the semiconductor device is extracted by the at least one processor. Based on the extracted location data, the extracted voltage data is incorporated, by the at least one processor, in the layout to generate a modified layout of the semiconductor device.

According to some embodiments, a semiconductor device design system comprises at least one processor configured as a location data extraction tool, a voltage data extraction tool and a voltage marker generation tool. The location data extraction tool is configured to extract location data of at least one electrical component in a layout of a semiconductor device. The voltage data extraction tool is configured to extract voltage data associated with the at least one electrical component based on a simulation of an operation of the semiconductor device. The voltage marker generation tool is configured to, based on the extracted location data, incorporate the extracted voltage data in the layout to generate a modified layout of the semiconductor device. The voltage data is incorporated in at least one marker layer of the modified layout.

According to some embodiments, a computer program product comprises a non-transitory, computer-readable medium containing therein instructions which, when executed by at least one processor, cause the at least one processor to perform one or more operations. In one or more operations, location data of at least one electrical component in a layout of a semiconductor device is extracted. In one or more operations, voltage data associated with the at least one electrical component and based on a simulation of an operation of the semiconductor device is extracted. In one or more operations, based on the extracted location data, the extracted voltage data is incorporated in the layout to generate a modified layout of the semiconductor device.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device design method performed by at least one processor, said method comprising:
   extracting, by the at least one processor, location data of at least one electrical component in a layout of a semiconductor device;
   extracting, by the at least one processor, voltage data associated with the at least one electrical component, the voltage data based on a result of a simulation of an operation of the semiconductor device;
   incorporating, by the at least one processor and based on the extracted location data, the extracted voltage data in the layout to generate a modified layout of the semiconductor device; and
   performing, by the at least one processor, a voltage-dependent design rule check (VDRC) on the modified layout, the VDRC comprising at least one voltage-dependent design rule that specifies a geometric value.

2. The method of claim 1, further comprising:
   performing the simulation of the operation of the semiconductor device.

3. The method of claim 1, wherein
   the voltage data includes a voltage value, and
   said incorporating comprises adding the voltage value to the layout and associated with the at least one electrical component.

4. The method of claim 1, further comprising:
   determining, by the at least one processor and from a table that contains a plurality of voltage indicators corresponding to a plurality of voltage values, a voltage indicator corresponding to a voltage value associated with the at least one electrical component and based on the simulation of the operation of the semiconductor device,
   wherein said incorporating comprises adding the determined voltage indicator, as the voltage data, to the layout and associated with the at least one electrical component.

5. The method of claim 1, wherein the voltage data is entirely based on the simulation of the operation of the semiconductor device.

6. The method of claim 1, wherein the voltage data is partially based on user input.

7. The method of claim 6, wherein said extracting voltage data comprises:
   obtaining, by the at least one processor, a simulated voltage value associated with the at least one electrical component from the simulation of the operation of the semiconductor device,
   obtaining, by the at least one processor, a user-defined voltage value associated with the at least one electrical component from the user input, and
   extracting, by the at least one processor and based on the greater of the simulated voltage value or the user-defined voltage value, the voltage data.

8. The method of claim 1, wherein
   the voltage data includes a maximum voltage value and a minimum voltage value, and
   said incorporating comprises adding the maximum and minimum voltage values to the layout and associated with the at least one electrical component.

9. The method of claim 8, further comprising:
   determining, by the at least one processor and based on the maximum voltage value and minimum voltage value, a voltage difference between the at least one electrical component and an adjacent electrical component in the layout of the semiconductor device, wherein the at least one voltage-dependent design rule is based on the determined voltage difference.

10. The method of claim 1, wherein said extracting location data of the at least one electrical component comprises extracting coordinates of the at least one electrical component from a layout-versus-schematic (LVS) database or from an automatic placement and routing (APR) database.

11. The method of claim 1, further comprising:
    generating the layout by an automatic placement and routing (APR) tool, which further performs said extracting location data of at least one electrical component.

12. The method of claim 1, further comprising at least one of
    decrypting an encrypted technology file, which includes a table correlating a plurality of voltage indicators to a plurality of voltage values, for use in said extracting voltage data; or
    encrypting the modified layout for output.

13. The method of claim 1, wherein the simulation comprises at least one of
    a simulation executed on a schematic of the semiconductor device, or
    a simulation executed on the layout of the semiconductor device.

14. The method of claim 1, further comprising
    generating a schematic of the semiconductor device, the schematic including the voltage data associated with the at least one electrical component.

15. The method of claim 1, further comprising:
    extracting, by the at least one processor, parasitic resistance and capacitance of interconnects in the layout of the semiconductor device.

16. A semiconductor device design system, comprising:
    at least one processor configured as:
    a location data extraction tool configured to extract location data of at least one electrical component in a layout of a semiconductor device;
    a voltage data extraction tool configured to extract voltage data associated with the at least one electrical component based on a result of a simulation of an operation of the semiconductor device;
    a voltage marker generation tool configured to, based on the extracted location data, incorporate the extracted voltage data in the layout to generate a modified layout of the semiconductor device, the voltage data incorporated in at least one marker layer of the modified layout; and
    a voltage-dependent design rule check (VDRC) tool to perform a VDRC on the modified layout, the VDRC comprising at least one voltage-dependent design rule that specifies a geometric value.

17. The system of claim 16, wherein the at least one processor is further configured as a simulation tool to perform the simulation of the operation of the semiconductor device.

18. The system of claim 16, wherein the voltage marker generation tool is configured to incorporate the extracted voltage data in the at least one marker layer in the form of at least one of
- a voltage value, or
- a voltage indicator associated with one or more voltage values as defined in a technology file.

19. A computer program product, comprising a non-transitory, computer-readable medium containing instructions therein which, when executed by at least one processor, cause the at least one processor to
- extract location data of at least one electrical component in a layout of a semiconductor device;
- extract voltage data associated with the at least one electrical component based on a result of a simulation of an operation of the semiconductor device;
- based on the extracted location data, incorporate the extracted voltage data in the layout to generate a modified layout of the semiconductor device; and
- perform a voltage-dependent design rule check (VDRC) on the modified layout, the VDRC comprising at least one voltage-dependent design rule that specifies a geometric value.

20. The system of claim 16, wherein the at least one processor is further configured as an extraction tool configured to extract parasitic resistance and capacitance of interconnects in the layout of the semiconductor device.

\* \* \* \* \*